United States Patent [19]

Go et al.

[11] Patent Number: 5,592,016

[45] Date of Patent: Jan. 7, 1997

[54] ANTIFUSE WITH IMPROVED ANTIFUSE MATERIAL

[75] Inventors: Ying Go, Palo Alto; John L. McCollum, Saratoga; Abdelshafy A. Eltoukhy, San Jose, all of Calif.

[73] Assignee: Actel Corporation, Sunnyvale, Calif.

[21] Appl. No.: 423,518

[22] Filed: Apr. 14, 1995

[51] Int. Cl.$^6$ .......................... H01L 29/04; H01L 27/10; H01L 29/00

[52] U.S. Cl. ..................... 257/530; 257/50; 257/208; 257/209; 257/528

[58] Field of Search .................. 257/50, 208, 209, 257/528, 530

[56] References Cited

U.S. PATENT DOCUMENTS

| | | | |
|---|---|---|---|
| 4,295,892 | 10/1981 | Matsuhisa et al. | 501/120 |
| 4,499,557 | 2/1985 | Holmberg et al. | 365/163 |
| 4,651,409 | 3/1987 | Ellsworth et al. | 29/576 |
| 4,748,490 | 5/1988 | Hollingsworth | 357/51 |
| 4,751,197 | 6/1988 | Wills | 437/174 |
| 4,796,075 | 1/1989 | Whitten | 357/51 |
| 4,822,753 | 4/1989 | Pintchovski et al. | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,912,066 | 3/1990 | Wills | 437/173 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |

(List continued on next page.)

FOREIGN PATENT DOCUMENTS

| | | | |
|---|---|---|---|
| 0414361 | 2/1991 | European Pat. Off. | H01L 23/52 |
| 0416903 | 3/1991 | European Pat. Off. | H01L 21/32 |
| 0452091 | 10/1991 | European Pat. Off. | H01L 23/525 |
| 0455414 | 11/1991 | European Pat. Off. | H01L 23/525 |
| 0500034 | 8/1992 | European Pat. Off. | H01L 23/525 |
| 0501120 | 9/1992 | European Pat. Off. | H01L 23/525 |
| 0528417 | 2/1993 | European Pat. Off. | H01L 27/112 |
| 0539197 | 4/1993 | European Pat. Off. | H01L 23/525 |
| 2367352 | 10/1977 | France | H01L 27/06 |
| 2222024 | 2/1990 | Great Britain | H01L 21/82 |
| 87/00969 | 2/1987 | WIPO | H01L 23/52 |
| 87/02827 | 5/1987 | WIPO | H01L 27/24 |
| 92/13359 | 8/1992 | WIPO | H01L 21/285 |
| 92/20109 | 11/1992 | WIPO | H01L 45/00 |
| 93/03499 | 2/1993 | WIPO | H01L 23/525 |
| 93/05514 | 3/1993 | WIPO | H01L 29/68 |
| 93/04499 | 3/1993 | WIPO | H01L 21/70 |

OTHER PUBLICATIONS

Chapman, et al., "A laser linking Process for Restructurable VLSI", CLEO '82, Apr. 14–16, 1982, MIT Lincoln Laboratory.

*Primary Examiner*—Mahshid D. Saadat
*Assistant Examiner*—Valencia Martin Wallace
*Attorney, Agent, or Firm*—D'Alessandro & Ritchie

[57] ABSTRACT

An antifuse comprises first and second electrodes separated by an antifuse material having a thickness selected to impart a desired target programming voltage to the antifuse. The antifuse material comprises a solid material stable at temperatures below about 600° C., having a defect density less than about 100 defects/cm$^2$, a breakdown field less than about 10 megavolts/cm, a dielectric constant lower than about 4.0, a resistivity of greater than about $10^4$ ohm-cm. The antifuse material may comprise organic materials such as polyimides compatible with high-temperature processes including cured polyamic acids, pre-imidazed polymers, photo-sensitive polyimides, and other polimides such as pyralin, probimide, PIQ, etc. The antifuse materials of the present invention also include fluorinated polymers having very low dielectric constants, such as teflon, paralines, polyphenylquinoxaline, benzocyclobutene polymers, and perfluoropolymers.

15 Claims, 13 Drawing Sheets

U.S. PATENT DOCUMENTS

| | | | |
|---|---|---|---|
| 5,134,584 | 7/1992 | Boler et al. | 365/200 |
| 5,166,556 | 11/1992 | Hsu et al. | 307/465 |
| 5,171,715 | 12/1992 | Husher et al. | 437/195 |
| 5,191,550 | 3/1993 | Kubota | 365/96 |
| 5,194,759 | 3/1993 | El-Ayat et al. | 307/202.1 |
| 5,196,724 | 3/1993 | Gordon et al. | 257/530 |
| 5,219,982 | 6/1993 | Buijsingh et al. | 528/392 |
| 5,233,206 | 8/1993 | Lee et al. | 257/50 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,250,459 | 10/1993 | Lee | 437/52 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |
| 5,300,456 | 4/1994 | Tigelaar et al. | 437/195 |
| 5,302,546 | 4/1994 | Gordon et al. | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,341,267 | 8/1994 | Whitten et al. | 361/56 |
| 5,353,246 | 10/1994 | Tsang et al. | 365/96 |
| 5,404,029 | 4/1995 | Husher et al. | 257/50 |
| 5,412,593 | 5/1995 | Magel et al. | 365/96 |

ANTIFUSE WITH IMPROVED ANTIFUSE MATERIAL

BACKGROUND OF THE INVENTION

1. Field of the Invention

The present invention relates to user-programmable antifuse elements. More particularly, the present invention relates to antifuses having hydrocarbon based, ceramic, and other novel antifuse material layers.

2. The Prior Art

Antifuses are well known in the prior art. Antifuses have been fabricated and proposed which employ one or more oxide or nitride layers as antifuse material layers. Examples of such antifuses include U.S. Pat. No. 4,543,594 to Mohsen et al., U.S. Pat. No. 4,823,181 to Mohsen et al., U.S. Pat. No. 4,899,205 to Hamdy et al.

Amorphous silicon has also been employed as an antifuse material layer, either by itself, or in combination with one or more oxide or nitride layers. Examples of such antifuses include U.S. Pat. No. 5,070,384 to McCollum et al., U.S. Pat. No. 5,171,715 to Husher et al., and U.S. Pat. No. 5,181,096 to Forouhi et al., U.S. Pat. No. 5,272,101 to Forouhi et al.,

BRIEF DESCRIPTION OF THE INVENTION

According to the present invention, an antifuse comprises first and second electrodes separated by an antifuse material having a thickness selected to impart a desired target programming voltage to the antifuse. The antifuse material comprises a solid material stable at temperatures below about 600° C., having a low defect density, a low breakdown field (i.e., less than about 10 megavolts/cm), a low moisture content, a dielectric constant lower than about 3.5, a resistivity of greater than about $10^4$ ohm-cm. According to a first embodiment of the present invention, the antifuse material is applied in a liquid state using spin-on techniques, and according to a second embodiment of the present invention, the antifuse material is applied using chemical vapor deposition (CVD) techniques.

According to the present invention, the antifuse material may comprise organic materials such as polyimides compatible with high-temperature processes. Such materials include cured polyamic acids, pre-imidazed polymers, photo-sensitive polyimides, and other polyimides such as pyralin, probimide, PIQ, etc. The antifuse materials of the present invention also include fluorinated polymers having very low dielectric constants (i.e., less than about 4), such as teflon, paralines, polyphenylquinoxaline, benzocyclobutene polymers, and perfluoropolymers.

The antifuse layer may also comprise ceramic materials such as $Al_2O_3$ (sapphire), which may be deposited by sputtering, ECR or PECVD techniques.

Finally, the antifuse material may comprise a material such as carbon, germanium, selenium, and compound semiconductor materials such as GaAs, SiC, AlP, InSb, CdTe.

The antifuses of the present invention may take any one of a number of via antifuse and stacked antifuse forms, depending on the method used for applying the antifuse material. In a first antifuse according to the present invention, an interlayer dielectric is formed over a lower antifuse electrode. An antifuse via is formed in the interlayer dielectric and antifuse material according to the present invention is formed in the antifuse via by CVD deposition techniques. An upper antifuse electrode is then formed.

In a second antifuse according to the present invention, a lower antifuse electrode is formed, and an interlayer dielectric is formed over the lower antifuse electrode. An antifuse via is formed in the interlayer dielectric and a conductive plug is formed in the antifuse via and planarized with the upper surface of the interlayer dielectric using known techniques. An antifuse layer is then applied using spin-on techniques. An upper electrode is then formed over the antifuse layer and the upper electrode and antifuse layers are defined using known etching techniques, such as plasma etching.

In a third antifuse according to the present invention, a lower antifuse electrode is formed, and an interlayer dielectric is formed over the lower antifuse electrode. An antifuse via is formed in the interlayer dielectric and a conductive plug is formed in the antifuse via and planarized with the upper surface of the interlayer dielectric using known techniques. An antifuse layer is then applied using spin-on techniques. A barrier layer is formed over the antifuse layer. An upper electrode is then formed over the barrier layer. The upper electrode, barrier layer, and antifuse layer are then defined using known etching techniques.

In a fourth antifuse according to the present invention, a lower antifuse electrode is formed and a barrier layer is formed over the lower antifuse electrode. An antifuse layer is then applied using spin-on techniques and is defined using known etching techniques. An interlayer dielectric is formed over the antifuse layer. An antifuse via is formed in the interlayer dielectric and a conductive plug is formed in the antifuse via and an upper electrode is then formed over the plug.

In a fifth antifuse according to the present invention, a lower antifuse electrode is formed and a first barrier layer is formed over the lower antifuse electrode. An antifuse layer is then applied using spin-on techniques and a second barrier layer is formed over the antifuse layer. This composite layer is defined using known etching techniques. An interlayer dielectric is formed over the second barrier layer. An antifuse via is formed in the interlayer dielectric and a conductive (i.e., tungsten) plug is formed in the antifuse via and an upper electrode is then formed over the plug.

In a sixth antifuse according to the present invention, a lower antifuse electrode is formed on a wafer and planarized using chem-mechanical polishing (CMP) techniques. A plurality of spaced-apart pads are formed on the wafer by, for example depositing a 500 angstrom thin film and etching with a mask. The antifuse material is then applied to the wafer using spin-on techniques. The spun-on layer is then forced to fill the voids between the pads by application of a press or roller.

In a seventh antifuse according to the present invention, a lower antifuse electrode is formed, and an interlayer dielectric is formed over the lower antifuse electrode. An antifuse via is formed in the interlayer dielectric and a conductive plug is formed in the antifuse via and planarized with the upper surface of the interlayer dielectric using known techniques. An extra over-etch is performed on the interlayer dielectric exposing the conductive plug, which protrudes from the interlayer dielectric by over 100 nm. Then an antifuse layer is applied using spin-on techniques. The thickness of the antifuse layer on top of the conductive plug is determined by surface tension of the spin on solution, thus a uniform thickness is achieved on top of the conductive plugs. Subsequently a barrier layer is formed over the antifuse layer. Known patterning techniques are used to define the barrier layer and the antifuse layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Throughout this disclosure, mention is made of various materials suitable for use as upper and lower antifuse electrodes and barrier layers. Those of ordinary skill in the art will readily observe that the present invention is not limited to antifuses employing the particular materials disclosed, but that other materials known in the art for use as electrodes and barrier materials may be used to fabricate the antifuses of the present invention.

Figure 1:
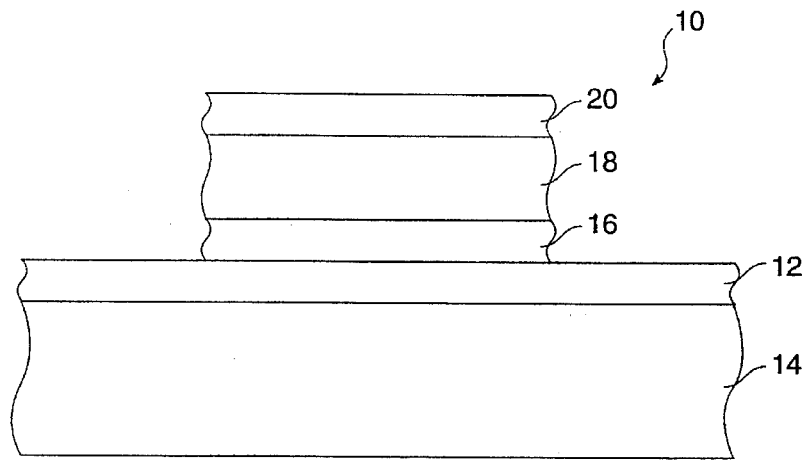
FIG. 1 is a cross-sectional view generally showing an antifuse according to the present invention.

Referring first to FIG. 1, a generalized antifuse 10 according to the present invention is shown in cross-sectional view. Antifuse 10 is fabricated over an insulating layer 12 disposed above a semiconductor substrate 14 as shown in FIG. 1. Persons of ordinary skill in the art will recognize that although FIG. 1 shows insulating layer 12 to be disposed immediately in contact with substrate 14, other intervening layers may be present depending on the nature of the integrated circuit with which antifuse 10 is used.

A first or lower conductive electrode 16 is disposed on the upper surface of insulating layer 12. First conductive electrode 16 may be formed from metals, such as are known for use in the formation of metal interconnect layers in integrated circuits. Examples of materials to use for first conductive electrode 16 include, but are not limited to aluminum, silicon, copper, titanium, tungsten, and their alloys or nitrides.

A layer of antifuse material 18 is disposed on the upper surface of first conductive electrode 16. According to the present invention, the layer of antifuse material 18 may be formed from one of a plurality of novel materials.

In addition to falling into one of the classes of materials set forth herein, in order to be considered for use as an antifuse material herein, a material must be a solid, must be stable at temperatures below about 600° C., must have a low defect density (i.e., less than about 100 defects/cm$^2$), must have a low breakdown field (i.e., less than about 10 megavolts/cm), and must have a low moisture content (i.e., less than about 15 wt % hydrogen). In addition, the antifuse material must have a dielectric constant lower than about 3.5, and a resistivity of greater than about 10$^4$ ohm-cm.

According to a first embodiment of the present invention, the antifuse material is applied in a liquid state using spin-on techniques, such as described in Hendricks et al., Fluorinated Poly(arylethers): *Low Dielectric Constant, Thermally Stable Polymers for Sub-Half Micron IMD Applications*, Feb. 21–22, 1995 DUMIC Conference, 1995ISMIC-101D/95/0283. According to a second embodiment of the present invention, the antifuse material may be applied using chemical vapor deposition (CVD) techniques, such as described in Zhang et al., Parylene-N ILD *Properties Under Different Deposition Pressures*, Feb. 21–22, 1995 DUMIC Conference, 1995ISMIC-101D/95/0290.

According to the present invention, the antifuse material may comprise organic materials such as polyimides compatible with high-temperature processes. Such materials include cured polyamic acids, pre-imidazed polymers, photo-sensitive polyimides, and other polyimides such as pyralin, probimide, PIQ, etc. The antifuse materials of the present invention also include fluorinated polymers having very low dielectric constants, such as teflon, paralines, polyphenylquinoxaline, benzocyclobutene polymers, and perfluoropolymers.

According to the present invention, the antifuse layer may also comprise ceramic materials such as Al$_2$O$_3$, which may be deposited by sputtering, ECR or PECVD techniques.

Finally, the antifuse material according to the present invention may comprise a material such as carbon, germanium, selenium, and compound semiconductor materials such as GaAs, SiC, AlP, InSb, CdTe.

A second conductive electrode 20 is disposed over the upper surface of the layer of antifuse material 18 to complete the antifuse 10 structure of the present invention. Persons of ordinary skill in the art will understand that first and second conductive electrodes 16 and 20 may likely comprise portions of metal layers otherwise used to form interconnects between elements on the integrated circuit containing antifuse 10.

Those of ordinary skill in the art will also appreciate that, while not shown in the figures herein, conventional steps will be employed to form contacts and passivation layers to complete an integrated circuit containing the antifuses of the present invention. These steps and structures are not shown or described herein to avoid overcomplicating the disclosure and thus obscuring the disclosure of the subject matter of the present invention.

As previously noted, the antifuses of the present invention may be configured in any one of numerous via-antifuse and stacked-antifuse forms. Depending on the form of the antifuse, one or more methods for applying the antifuse layer to the structure may be employed.

Figure 2:
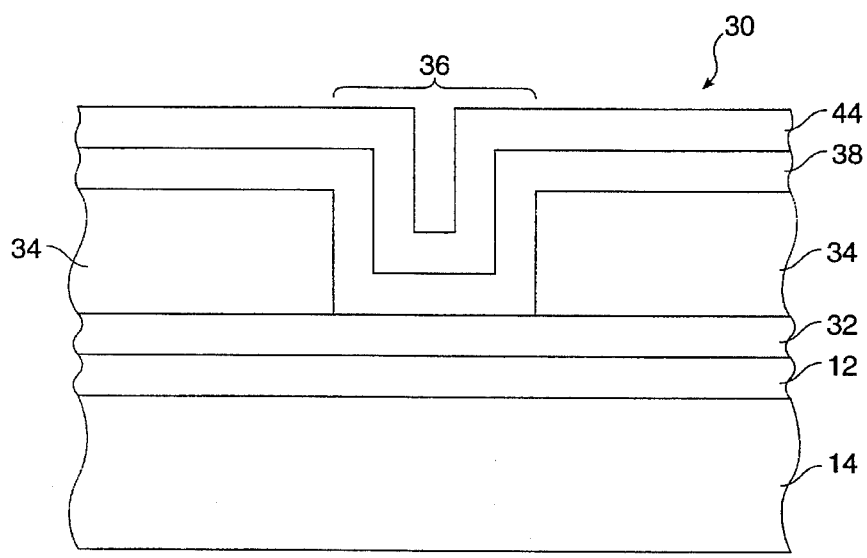
FIG. 2 is a cross-sectional view of an antifuse according to a first embodiment of the present invention.

FIG. 2 is a cross-sectional view of an antifuse according to a first embodiment of the present invention. The antifuse 30 of FIG. 2 is formed in a via in an interlayer dielectric (ILD) layer as is known in the art. Thus, antifuse 30 is shown formed over an insulating layer 12 formed over substrate 14. Those of ordinary skill in the art will recognize that if substrate 14 is non-conductive, insulating layer 12 may not be necessary absent any need for adhesion promotion.

Antifuse 30 comprises a first electrode 32 disposed on the surface of insulating layer 14. First electrode 32 may comprise a metal layer or a metal layer covered with a barrier layer as is known in the art. An ILD layer 34 is disposed over the upper surface of first electrode 32 and has an antifuse via 36 formed therein to expose the upper surface of first electrode 32. A layer of antifuse material 38 is disposed in antifuse via 36 and a second electrode 44 is disposed over the antifuse material 38 layer and typically extends across at least a portion of the upper surface of the ILD layer 34.

Figure 3A:
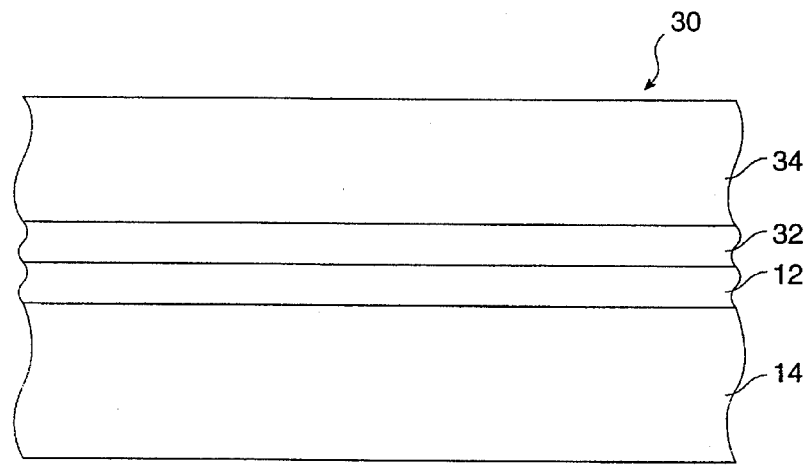
FIGS. 3a–3c are cross-sectional views of the antifuse of FIG. 2 after the completion of selected steps during its fabrication.
Figure 3B:
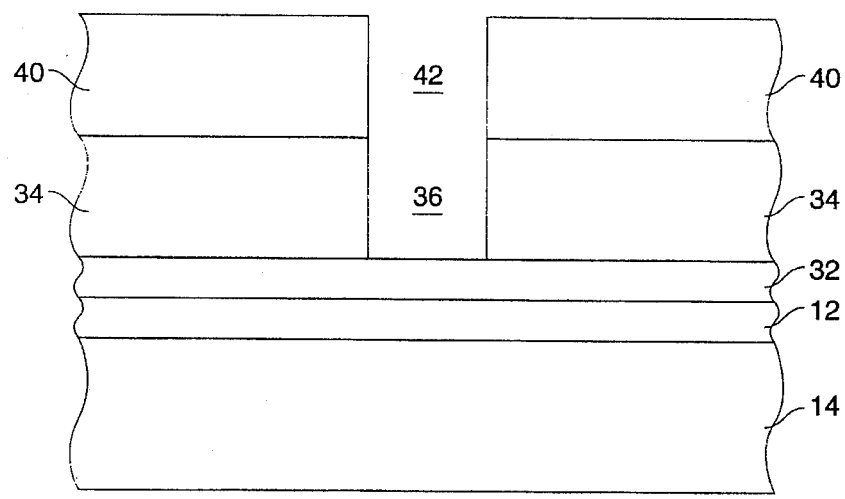
Figure 3C:
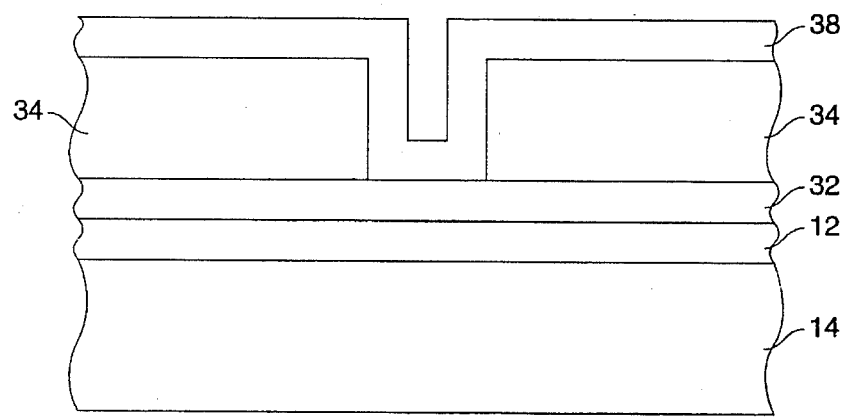

FIGS. 3a–3c are cross-sectional views of the antifuse of FIG. 2 after the completion of selected steps during its fabrication. Referring now to FIG. 3a, antifuse 30 is shown after formation of the first electrode 32 and ILD layer 34 over insulating layer 12 on substrate 14. First electrode 32 may be formed using deposition techniques, as is known in the art, and ILD layer 34 may comprise an oxide of silicon form using CVD techniques or thermal oxidation.

As may be seen from FIG. 3b, a photomask layer 40 is placed over the ILD layer 34 using conventional photolithography techniques. An etching step is performed to form antifuse via 36 in the aperture 42 of photomask layer 40, either using a wet etch or a plasma etch step as is known in the art. FIG. 3b shows the structure resulting after the etch steps has been completed to expose the upper surface of the first electrode 32 in the bottom of antifuse via 36.

Referring now to FIG. 3c, the photormask layer 40 has been removed and a layer of antifuse material 38 has been formed in antifuse via 36. According to this aspect of the present invention, CVD techniques are employed to deposit the antifuse material 38 into antifuse via 36. FIG. 3c shows the structure resulting after the completion of this step.

Finally, the second electrode 44 is formed over the upper surfaces of the ILD 34 and the antifuse material 38 in the antifuse via 36 using commonly-used deposition techniques. The completed structure is shown in FIG. 2.

Several embodiments of the present invention utilize plug technology, wherein a plug formed from a material such as tungsten is used to fill a via, allowing the antifuse material to be applied as a planar layer in a stacked antifuse structure. In such embodiments of the present invention, spin-on techniques may be used to apply the antifuse material in a liquid state.

Figure 4:
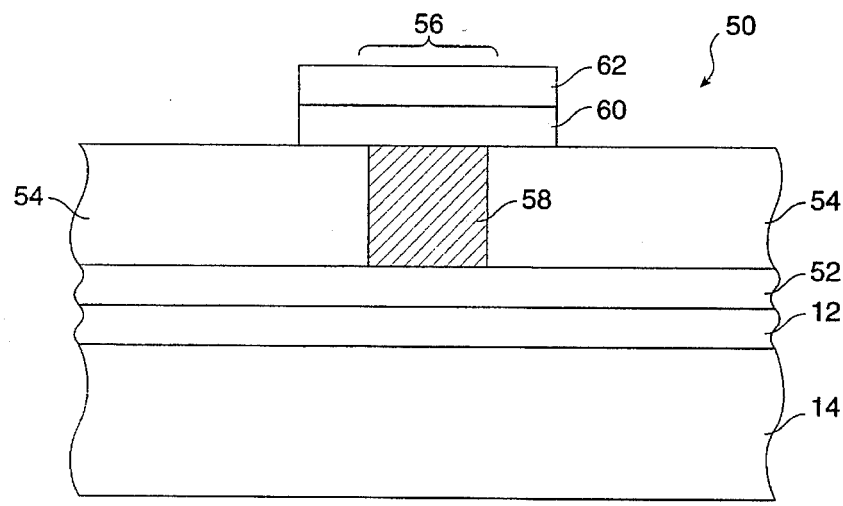
FIG. 4 is a cross-sectional view of an antifuse according to a second embodiment of the present invention.
Figure 5A:
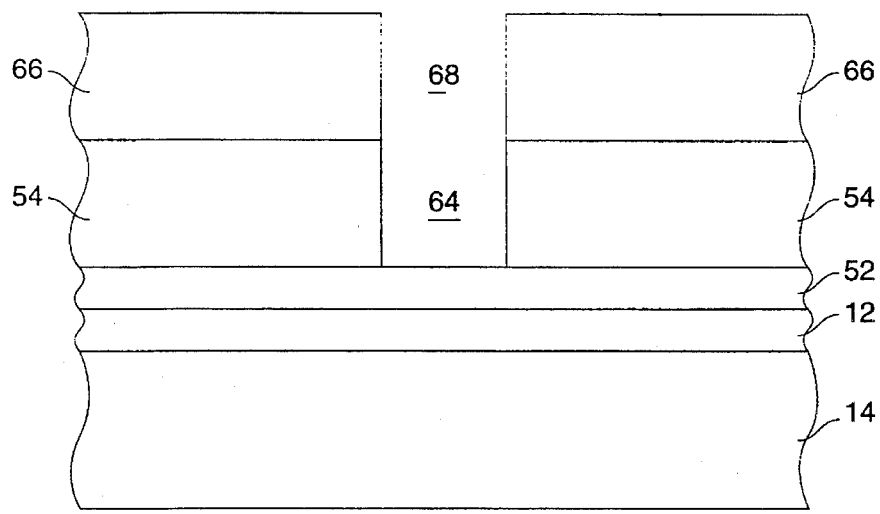
FIGS. 5a–5c are cross-sectional views of the antifuse of FIG. 4 after the completion of selected steps during its fabrication.
Figure 5B:
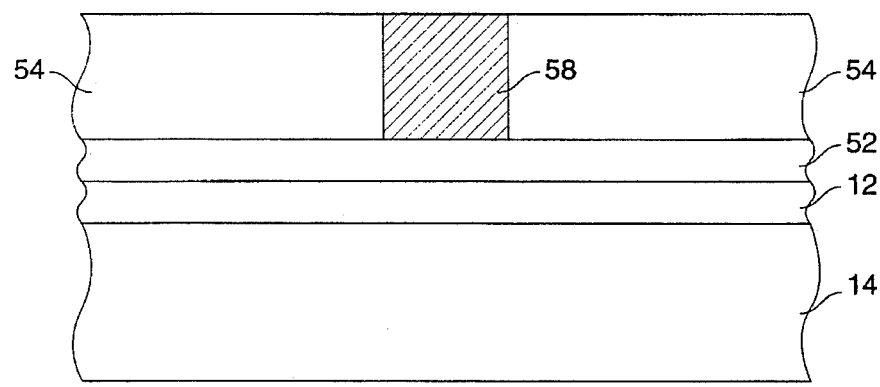
Figure 5C:
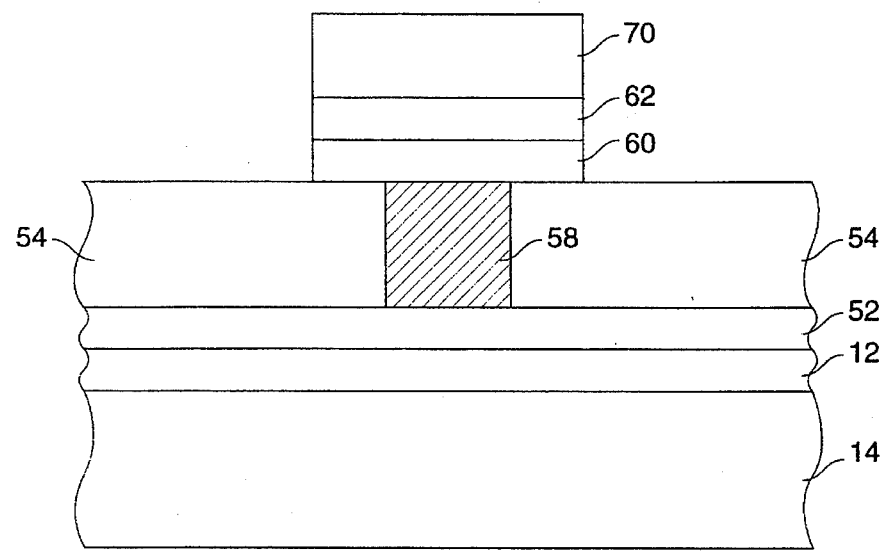

FIG. 4 is a cross-sectional view of an antifuse 50 according to a second embodiment of the present invention, and FIGS. 5a–5c are cross-sectional views of the antifuse 50 of FIG. 4 after the completion of selected steps during its fabrication.

As may be seen from FIG. 4, antifuse 50 is formed over an insulating layer 12 (typically an oxide) disposed on (or over one or more layers above) the surface of substrate 14. A first electrode 52, typically formed from the materials previously disclosed herein, is disposed on the upper surface of the insulating layer 12. An ILD layer 54, which may be formed from deposited oxide, is disposed on the upper surface of first electrode 52. An aperture 56 is formed in the ILD layer 54 and is filled with a plug 58, typically formed from a material such as tungsten. The upper surfaces of the plug 58 and the ILD 54 are substantially planar. A layer of antifuse material 60 according to the present invention is disposed over the upper surfaces of the plug 58 and the ILD 54. A second electrode 62 is disposed on the upper surface of the layer of antifuse material 60.

The fabrication steps used to form antifuse 50 may be seen with reference to FIGS. 5a–5c, cross-sectional views of the antifuse 50 of FIG. 4 after the completion of selected steps during its fabrication, to which attention is now drawn with reference initially to FIG. 5a. First, the lower or first electrode 52, typically formed from aluminum or titanium using sputtering techniques, is deposited on the upper surface of insulating layer 12. An etching step may be employed as is well known in the art to define the layer from which first electrode 52 is formed into various interconnect conductors and antifuse electrodes.

Next, the ILD layer 54 is formed on the upper surface of first electrode 52 from a material such as silicon dioxide. A conventional masking step is performed to apply photomask 66 having opening 68 therein and a conventional etching step is performed to form antifuse aperture 64. FIG. 5a shows the structure resulting after the completion of these steps but prior to the removal of masking layer 66.

Referring now to FIG. 5b, masking layer 66 has been removed and a tungsten plug 58 has been formed in the antifuse aperture 64. The upper surfaces of the ILD layer 54 and the tungsten plug 58 may be planarized by employing CMP techniques or may be plasma etched using an oxygen-freon plasma, for example. FIG. 5B shows the structure resulting after planarization of the upper surface of ILD layer 54 and plug 58.

Referring now to FIG. 5c, the layer of antifuse material 60 is then applied. Because the upper surfaces of the plug 58 and the ILD layer 54 are substantially planar, the layer of antifuse material 60 may be applied in a liquid phase by employing spin-on techniques as is known in the art. After the layer of antifuse material 60 has been applied and has solidified, the second electrode 62 is formed from a material such as aluminum, titanium, or tungsten alloys, using sputtering techniques.

The second electrode 62 and the layer of antifuse material 60 are then defined using standard photolithographic and etching techniques. A masking layer 70 is applied to define the second electrode 62 and antifuse material 60 layer. FIG. 5c shows the structure resulting after the etching step but prior to the removal of the masking layer 70 used to define the second electrode 62 and the layer of antifuse material 60. After removal of the masking layer 70, the finished antifuse 50 structure is shown in FIG. 4. Those of ordinary skill in the art will recognize that the conventional passivation and contact layers present in all such structures are not shown in the figures.

Figure 6:
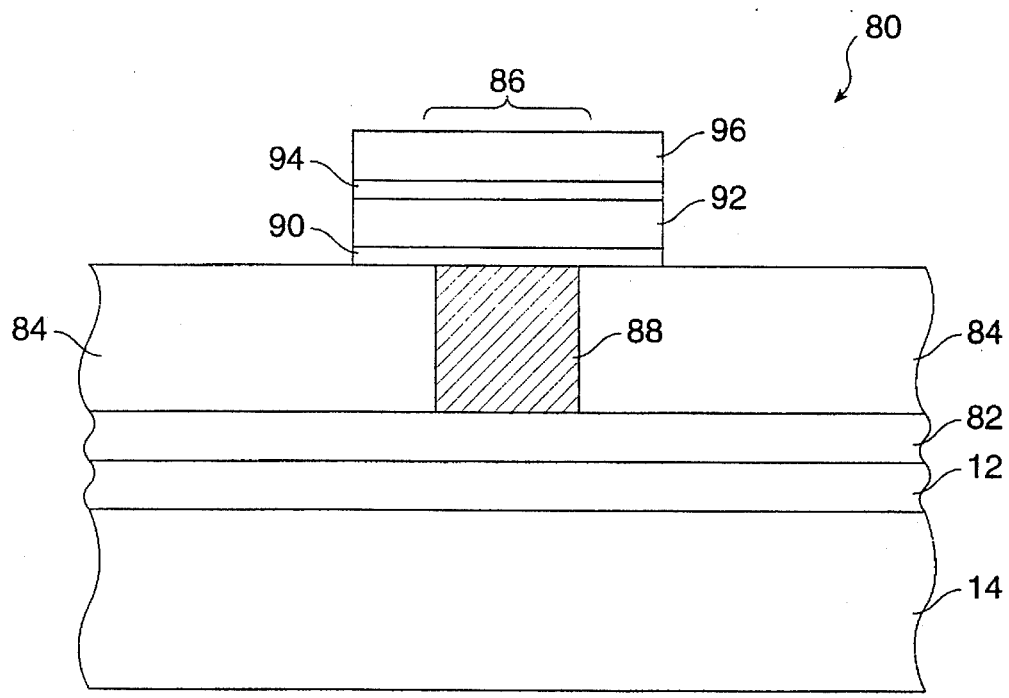
FIG. 6 is a cross-sectional view of an antifuse according to a third embodiment of the present invention.
Figure 7A:
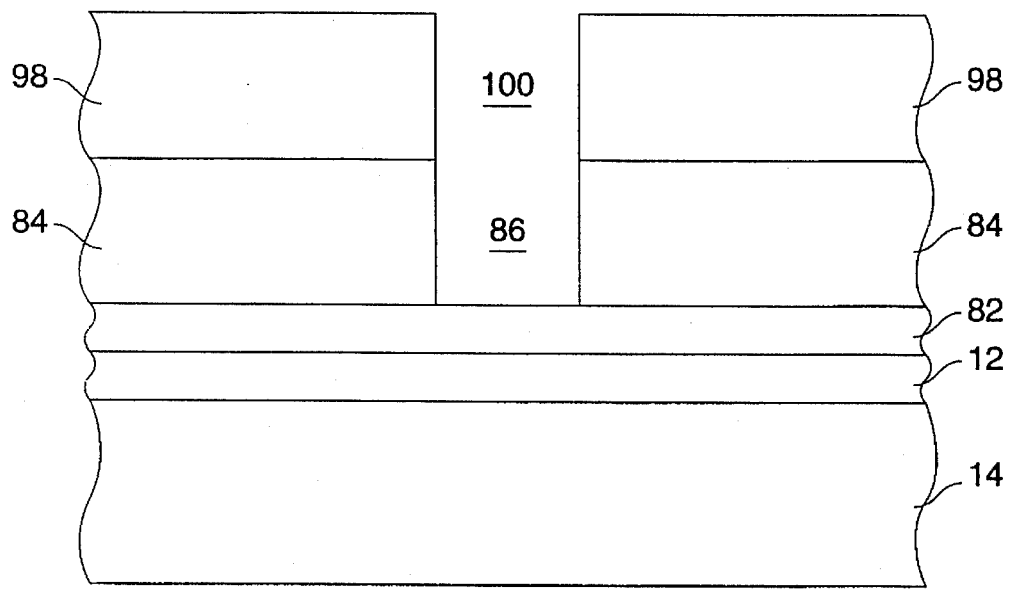
FIGS. 7a–7c are cross-sectional views of the antifuse of FIG. 6 after the completion of selected steps during its fabrication.
Figure 7B:
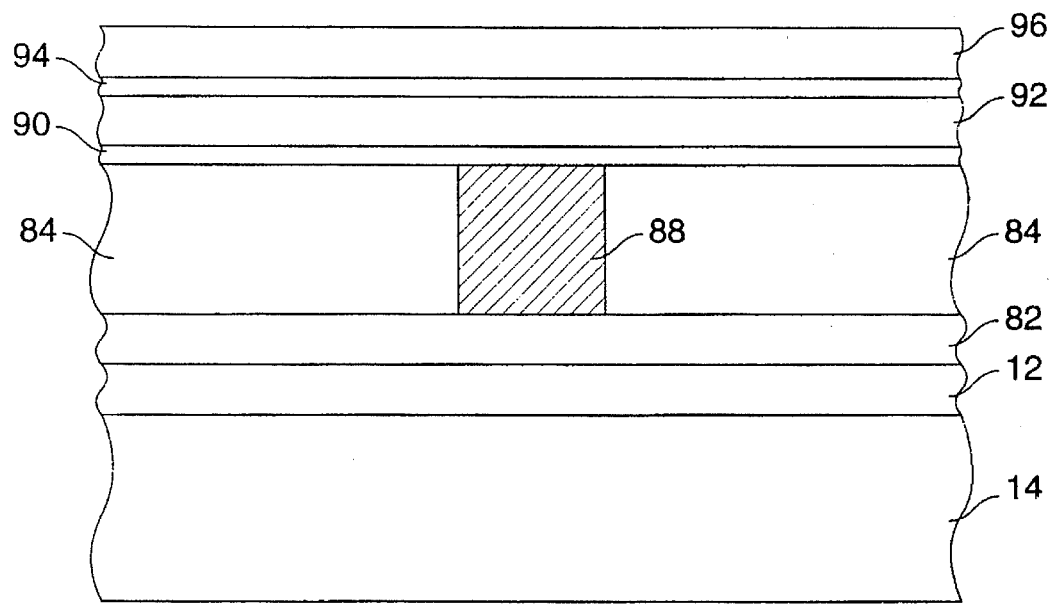
Figure 7C:
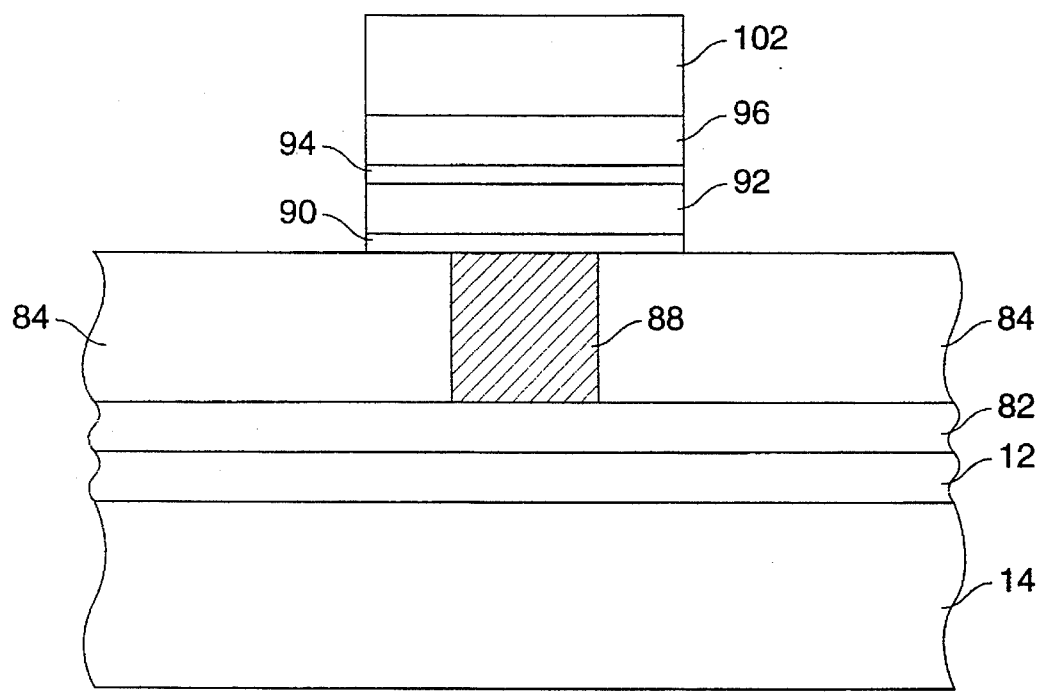

FIG. 6 is a cross-sectional view of an antifuse 80 according to a third embodiment of the present invention. FIGS. 7a–7c are cross-sectional views of the antifuse 80 of FIG. 6 after the completion of selected steps during its fabrication.

The embodiment depicted in FIGS. 6 and 7a–7c is quite similar to the embodiment depicted in FIGS. 4 and 5a–5c except that layers of barrier metal isolate the layer of antifuse material from the surrounding structures.

As may be seen from FIG. 6 antifuse 80 is formed over an insulating layer 12 (typically an oxide) disposed on (or over one or more layers above) the surface of substrate 14. A first electrode 82, typically formed from aluminum, titanium, or tungsten alloys, is disposed on the upper surface of the insulating layer 12. An ILD layer 84, which may be formed from silicon dioxide, is disposed on the upper surface of first electrode 82. An aperture 86 is formed in the ILD layer 84 and is filled with a plug 88, typically formed from a material such as tungsten, or titanium alloys or nitride. The upper surfaces of the plug 88 and the ILD layer 84 are substantially planar. A first barrier metal layer 90 is disposed over the upper surfaces of the plug 88 and the ILD layer 84. A layer of antifuse material 92 according to the present invention is disposed on the upper surface of the first barrier metal layer 90. A second barrier metal layer 94 is disposed on the upper surface of the layer of antifuse material 92 and forms at least part of a second electrode. A second electrode 96 is shown in FIG. 6 forming the majority of the thickness of the second electrode.

Those of ordinary skill in the art will appreciate that the first and second barrier metal layers 90 and 94 are used to protect the antifuse material layer. Instances in which such layers may be employed would include tungsten, or titanium alloys or nitrides.

The fabrication steps used to form antifuse 80 may be seen with reference to FIGS. 7a–7c, cross-sectional views of the antifuse 80 of FIG. 6 after the completion of selected steps during its fabrication, to which attention is now drawn with reference initially to FIG. 7a. First, the lower or first electrode 82, formed from aluminum or titanium nitride using sputtering techniques, is deposited on the upper surface of insulating layer 12. As with the embodiment of FIG. 4, an etching step may be employed as is well known in the art to define the layer from which first electrode 82 is formed into various interconnect conductors and antifuse electrodes.

Next, the ILD layer 84 is formed on the upper surface of first electrode 82 from a material such as silicon dioxide. Masking layer 98, having an opening 100 is applied to the surface of ILD layer 84 using conventional photolithography technology. An etching step is then performed to form aperture 86. FIG. 7a shows the structure resulting after the completion of these steps but prior to the removal of masking layer 98 used to define aperture 86.

Referring now to FIG. 7b, masking layer 98 has been removed, a tungsten plug 88 has been formed in the aperture 86, using a thin titanium nitride adhesion promoting layer (not shown) as is known in the art. The upper surfaces of the ILD layer 84 and the tungsten plug 88 may be planarized by employing CMP techniques or may be plasma etched using an oxygen-freon plasma, for example. After planarization, first barrier layer 90 is formed from a material such as titanium nitride, using sputtering techniques.

Because the upper surfaces of the plug 88 and the ILD 84, and the first barrier layer 90 are substantially planar, the layer of antifuse material 92 may be applied in a liquid phase by employing spin-on techniques as is known in the art. After the layer of antifuse material 92 has been applied and has solidified, the second barrier metal layer 94 is formed on its upper surface from a material such as titanium nitride, using sputtering techniques. The second electrode 96 is then formed on the upper surface of the second barrier metal layer 94 from a material such as aluminum, using sputtering techniques. FIG. 7b shows the structure resulting after formation of second electrode 96 has been completed.

Referring now to FIG. 7c, the second electrode 96, second barrier metal layer 94, and the layer of antifuse material 92 are then defined. A masking layer 102 is applied using standard photolithographic and etching techniques. FIG. 7c shows the structure resulting after the etching step but prior to the removal of the masking layer 102 used to define the sandwich structure comprising second electrode 96, second barrier metal layer 94 and the layer of antifuse material 92. After removal of the masking layer 102, the finished antifuse structure is shown in FIG. 6. As with the earlier drawing figures, those of ordinary skill in the art will recognize that the conventional passivation and contact layers present in all such microcircuit structures are not shown in FIG. 6.

Figure 8:
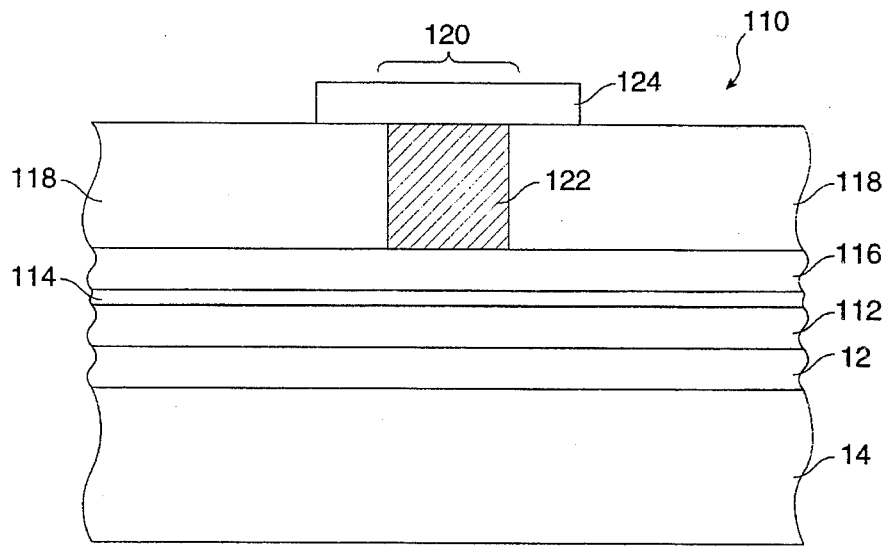
FIG. 8 is a cross-sectional view of an antifuse according to a fourth embodiment of the present invention.

FIG. 8 is a cross-sectional view of an antifuse 110 according to a fourth embodiment of the present invention. The antifuse embodiment depicted in FIGS. 8 and 9a–9c, as well as the related embodiment depicted in FIGS. 10 and 11a–11c, is also a stacked antifuse structure, however, those of ordinary skill in the art will realize that it is somewhat inverted from the antifuse embodiments of those figures since the layer of antifuse material is positioned under the ILD layer.

Referring now to FIG. 8, antifuse 110 is formed over an insulating layer 12 (typically an oxide) disposed on (or over one or more layers above) the surface of substrate 14. A first electrode 112, typically formed from aluminum, is disposed on the upper surface of the insulating layer 12. A barrier metal layer 114 is disposed on the upper surface of first electrode 102. A layer of antifuse material 116 according to the present invention is disposed over the upper surfaces of the barrier metal layer 114. An ILD layer 118, which may be formed from silicon dioxide, is disposed on the upper surface of the layer of antifuse material 116. An aperture 120 is formed in the ILD layer 118 and is filled with a plug 122, typically formed from a material such as tungsten. The upper surfaces of the plug 122 and the ILD layer 118 are substantially planar. A second electrode 124 is disposed on the upper surfaces of the ILD layer 118 and the plug 122.

Figure 9A:
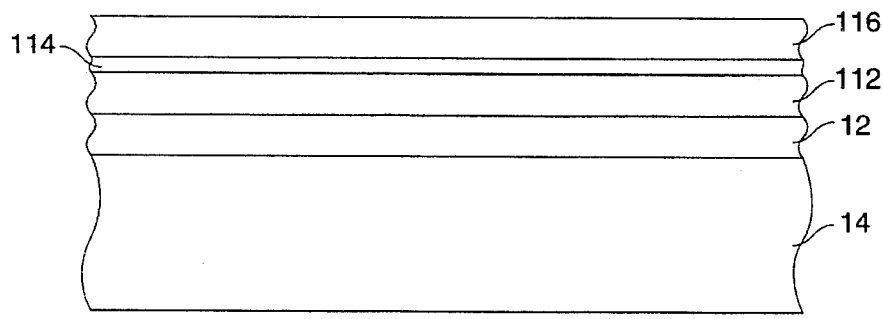
FIGS. 9a–9c are cross-sectional views of the antifuse of FIG. 8 after the completion of selected steps during its fabrication.
Figure 9B:
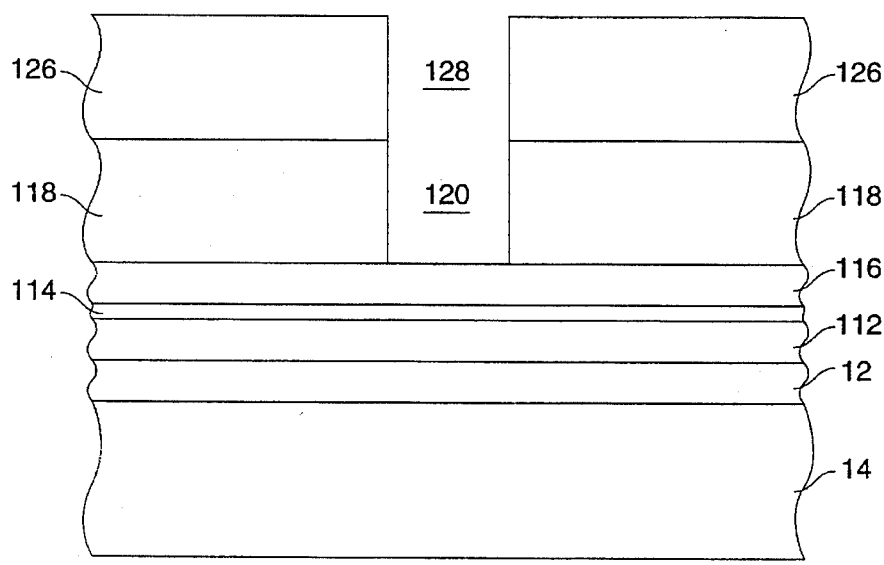
Figure 9C:
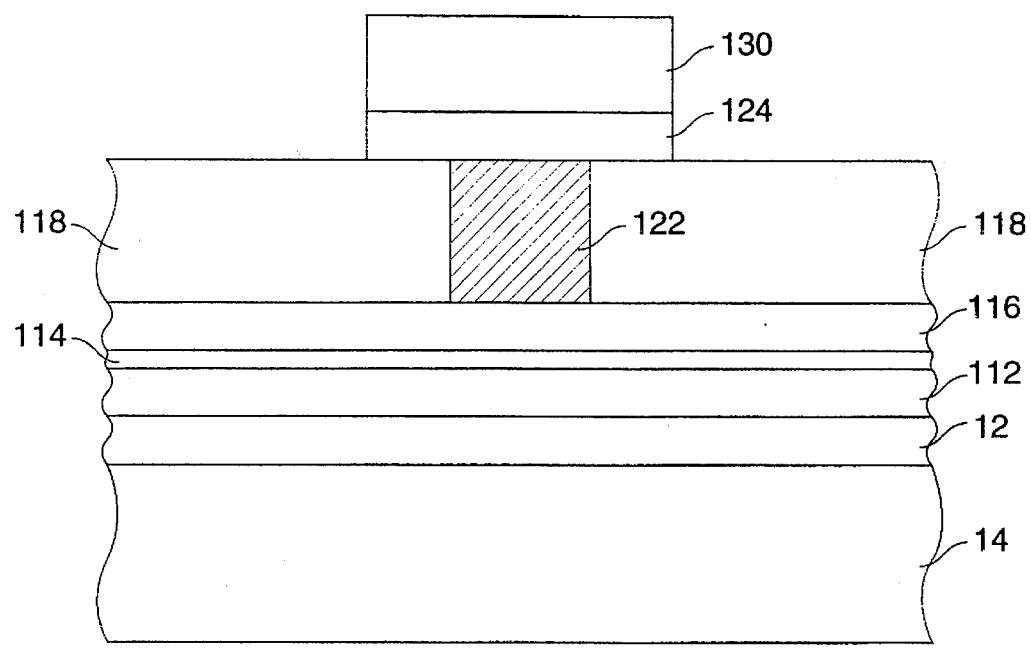

The fabrication steps used to form antifuse 110 may be seen with reference to FIGS. 9a–9c, cross-sectional views of the antifuse 110 of FIG. 8 after the completion of selected steps during its fabrication, to which attention is now drawn with reference initially to FIG. 9a. First, the lower or first electrode 112, formed from aluminum using sputtering techniques, is deposited on the upper surface of insulating layer 12. A barrier metal layer 114 is formed on the upper surface of first electrode 112. An etching step (not illustrated) may be employed as is well known in the art to define the composite layers from which first electrode 112 and barrier metal layer 114 are formed into various interconnect conductors and antifuse electrodes. The layer of antifuse material 116 is then formed on the upper surface of barrier metal layer 114. FIG. 9a shows the structure resulting after the completion of these steps.

Referring now to FIG. 9b, the ILD layer 118 is formed on the upper surface of antifuse material 116 from a material such as silicon dioxide. A conventional masking step is used to apply masking layer 126 having opening 128. A conventional etching step is performed to form aperture 120. FIG. 9b shows the structure resulting after the completion of these steps but prior to the removal of masking layer 126 used to define aperture 120.

Referring now to FIG. 9c, masking layer 126 has been removed and a tungsten plug 122 has been formed in the aperture 120. As with the prior-disclosed embodiments, the upper surfaces of the ILD layer 118 and the tungsten plug 122 may be planarized by employing CMP techniques or may be plasma etched using an oxygen-freon plasma, for example. The second electrode 124 is then formed from a material such as aluminum, using sputtering techniques.

The second electrode 124 is then defined using standard photolithographic and etching techniques. A masking layer 130, applied using standard photolithographic techniques, is used to define second electrode 124 as is known in the art. FIG. 9c shows the structure resulting after the etching step but prior to the removal of the masking layer 130 used to define the second electrode 124. After removal of the masking layer 130, the finished antifuse 110 structure is shown in FIG. 8. Those of ordinary skill in the art will recognize that the conventional passivation and contact layers present in all such structures are not shown in the figures.

Figure 10:
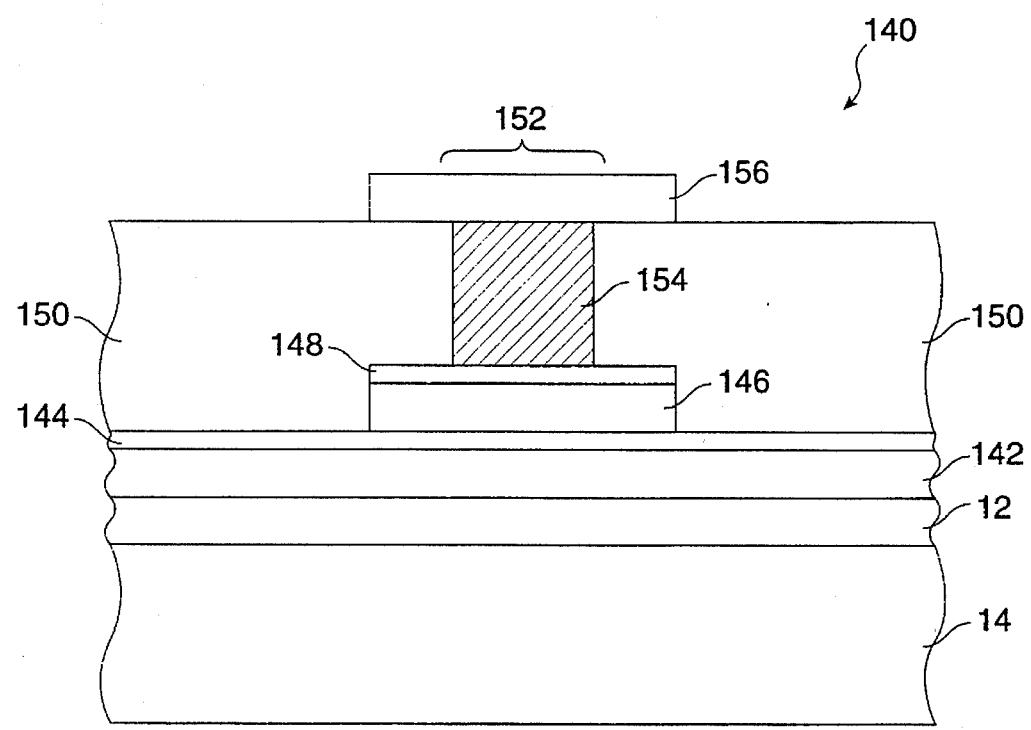
FIG. 10 is a cross-sectional view of an antifuse according to a fifth embodiment of the present invention.

Referring now to FIG. 10, an inverted-stack antifuse embodiment similar to that of FIG. 8 is depicted. antifuse 140 is formed over an insulating layer 12 (typically an oxide) disposed on (or over one or more layers above) the surface of substrate 14. A first electrode 142, typically formed from aluminum, is disposed on the upper surface of the insulating layer 12. A first barrier metal layer 144 is disposed on the upper surface of first electrode 142. A layer of antifuse material 146 according to the present invention is disposed over the upper surfaces of the barrier metal layer 144. A second barrier layer 148 is disposed on the upper surface of the layer of antifuse material 146. An ILD layer 150, which may be formed from silicon dioxide, is disposed on the upper surface of the layer of second barrier layer 148. An aperture 152 is formed in the ILD layer 150 and is filled with a plug 154, typically formed from a material such as tungsten. The upper surfaces of the plug 154 and the ILD layer 150 are substantially planar. A second electrode 156 is disposed on the upper surfaces of the ILD layer 150 and the plug 154.

Figure 11A:
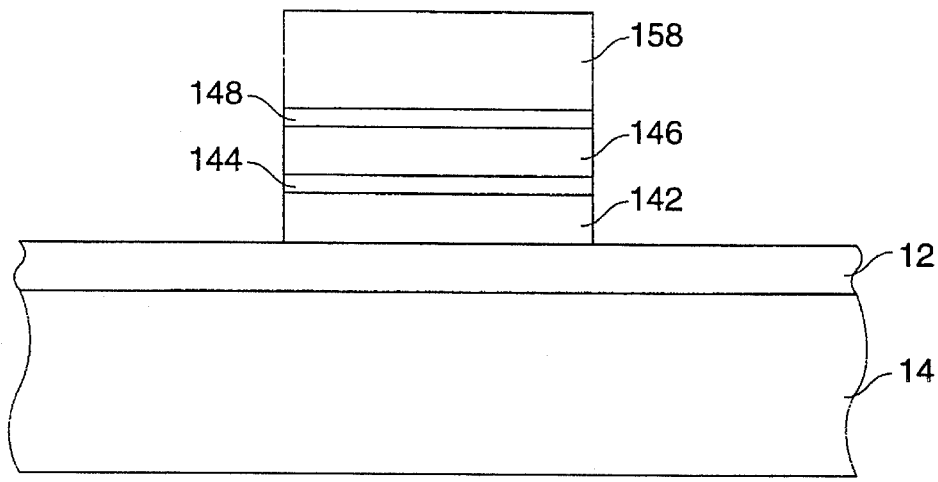
FIGS. 11a–11c are cross-sectional views of the antifuse of FIG. 10 after the completion of selected steps during its fabrication.
Figure 11B:
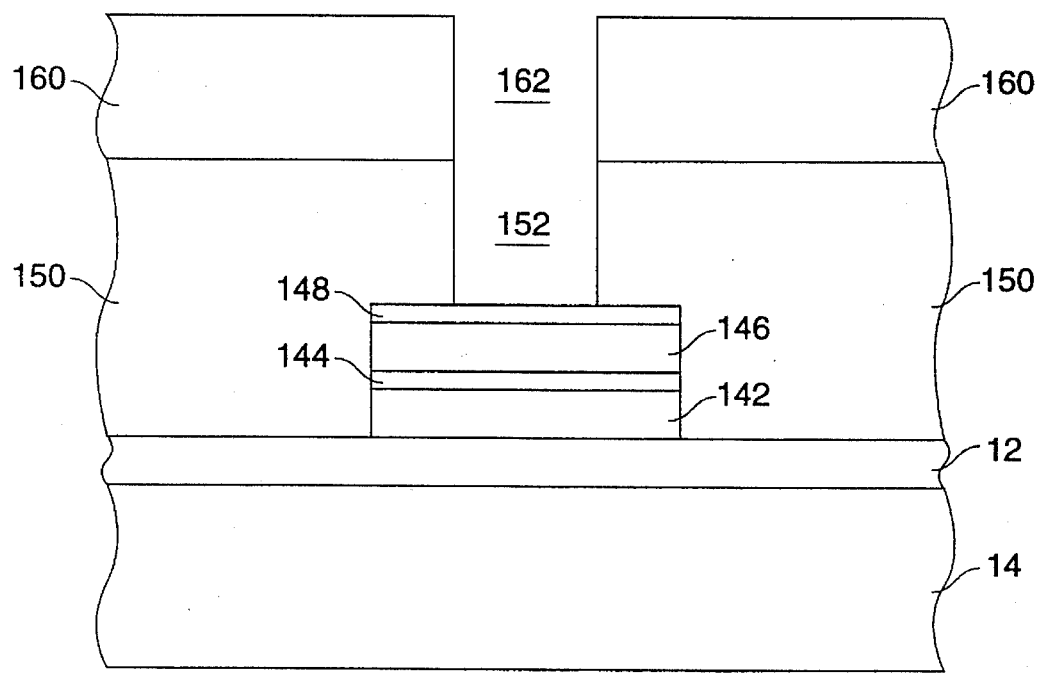
Figure 11C:
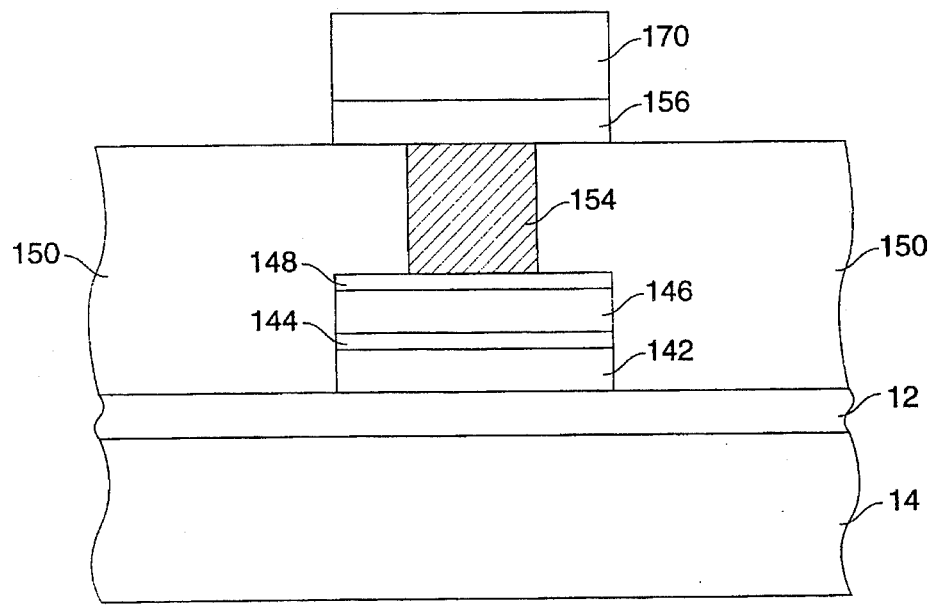

The fabrication steps used to form antifuse 140 may be seen with reference to FIGS. 11a–11c, cross-sectional views of the antifuse 140 of FIG. 10 after the completion of selected steps during its fabrication, to which attention is now drawn with reference initially to FIG. 11a. First, the lower or first electrode 142, formed from aluminum using sputtering techniques, is deposited on the upper surface of insulating layer 12. A first barrier metal layer 144 is formed on the upper surface of first electrode 142. An etching step (not shown) may be employed as is well known in the art to define the composite layers from which first electrode 142 and first barrier metal layer 144 are formed into various interconnect conductors and antifuse electrodes. The layer of antifuse material 146 is then formed on the upper surface of first barrier metal layer 144. A second barrier layer 148 is then formed on the upper surface of antifuse material 146. The stack comprising the second barrier layer 148 and the antifuse material layer 146 is then defined using masking layer 158 and conventional etching steps. FIG. 11a shows the structure resulting after the completion of these steps but prior to the removal of masking layer 158.

Referring now to FIG. 11b, masking layer 158 has been removed and the ILD layer 150 is formed on the upper surface of the defined stack comprising second barrier layer 148, the antifuse material layer 146 and the first barrier metal layer 144. A masking layer 160 having a mask opening 162 is formed over the surface of the ILD layer 150 using conventional photolithography techniques. A conventional etching step is performed to form an aperture 152 in ILD layer 150. FIG. 11b shows the structure resulting a completion of these steps but prior to the removal of masking layer 160 used to define aperture 152.

Referring now to FIG. 11c, masking layer 160 has been removed and a tungsten plug 154 has been formed in the aperture 152. As with the prior-disclosed embodiments, the upper surfaces of the ILD layer 150 and the tungsten plug 154 may be planarized by employing CMP techniques or may be plasma etched using an oxygen-freon plasma, for example. The second electrode 156 is then formed from a material such as titanium nitride, using sputtering techniques.

The second electrode 156 is then defined using standard photolithographic and etching techniques. A masking layer 170 is applied, exposed, and developed using conventional photolithography techniques. A conventional etching step is then performed to define second electrode 156. FIG. 11c shows the structure resulting after the etching step but prior to removal of the masking layer 170. After removal of the masking layer 170 used to define the second electrode 156, the finished antifuse 140 structure is shown in FIG. 10. Those of ordinary skill in the art will recognize that the conventional passivation and contact layers present in all such structures are not shown in the figures.

Figure 12:
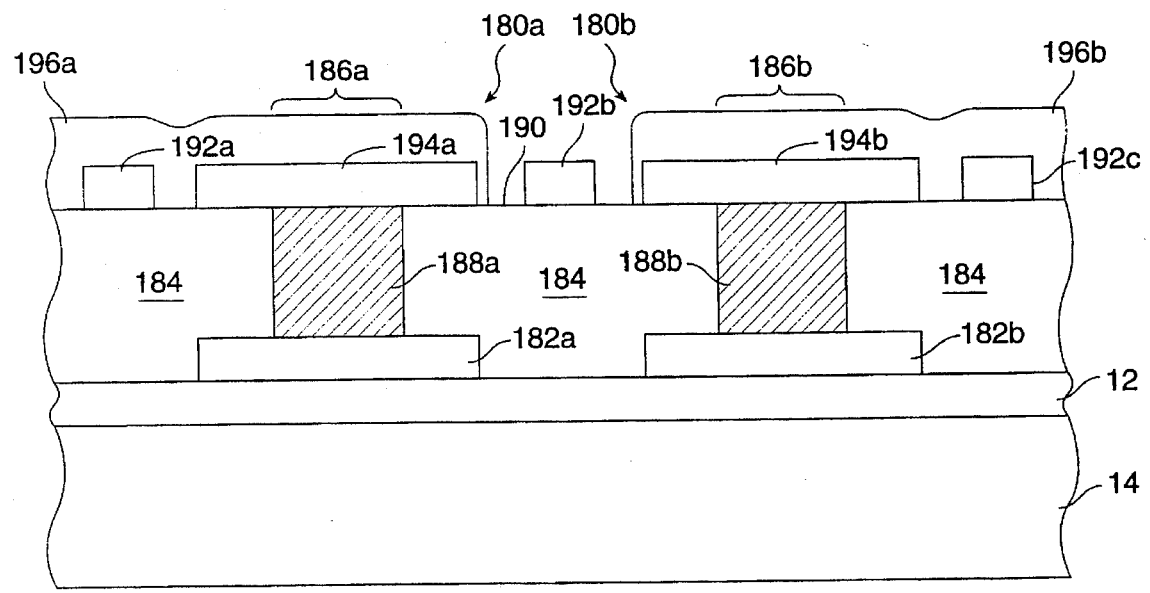
FIG. 12 is a cross-sectional view of an antifuse according to a sixth embodiment of the present invention.

A pair of antifuses according to a sixth embodiment of the present invention is illustrated in FIG. 12. Antifuses 180a and 180b may be formed on an insulating layer 12 formed over a substrate 14. A first antifuse electrode 182 is formed from a material such as aluminum or tungsten, having a substantially planar surface. An interlayer dielectric 184 is formed over the upper surface of the first antifuse electrode 182 and antifuse vias 186a and 186b are formed therein. Plugs 188a and 188b, formed from a material such as tungsten, are disposed in vias 186a and 186b. The upper surface 190 of interlayer dielectric 184 and plugs 188a and 188b are planarized using chem-mechanical polishing (CMP) techniques. A plurality of spaced-apart pads 192a, 192b, and 192c are formed on the planarized surface 190 by, for example depositing a 500 angstrom thin film of titanium, its alloys or nitrides, or any other material having an etching selectivity against the interlayer dielectric and plug material, and etching with a photomask using conventional photolithography techniques. A layer of antifuse material is then applied to the wafer using spin-on techniques. The spun-on antifuse layer 194 is forced to fill the voids between the pads by application of a press or roller and is patterned and defined into segments 194a and 194b. Second electrodes 196a and 196b are then formed over the surface of the antifuse layer 194. Second electrodes 196a and 196b are shown separate for antifuses 180a and 180b, although those of ordinary skill in the art will recognize that it could be left as a single segment such that antifuses 180a and 180b are electrically connected to one another. As in the previous embodiments, barrier layers may be optionally employed.

Figure 13A:
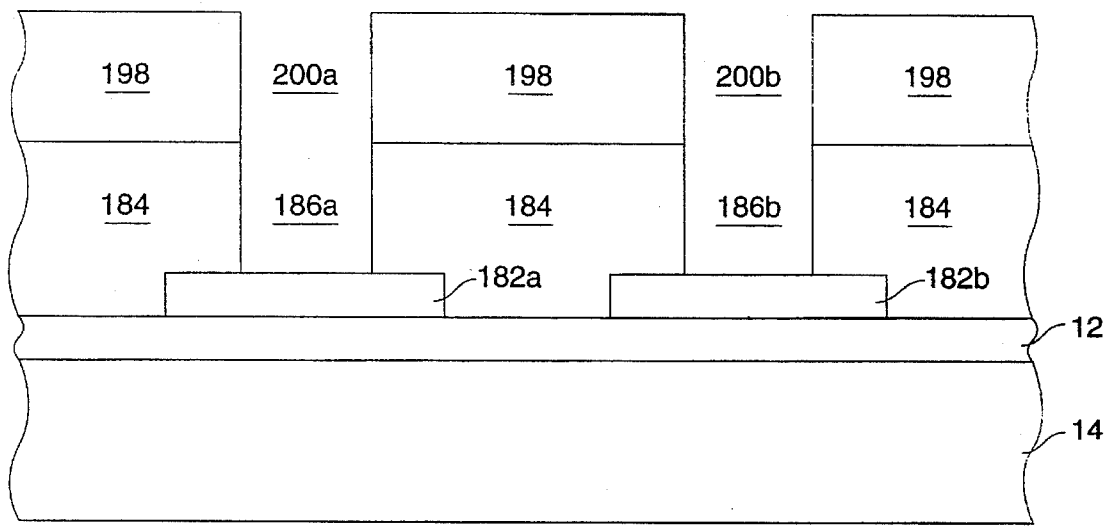
FIGS. 13a–13d are cross-sectional views of the antifuse of FIG. 12 after the completion of selected steps during its fabrication.

Referring now to FIGS. 13a–13d, the steps used to fabricate antifuses 180a and 180b will be illustrated. Referring first to FIG. 13a, a first electrode for antifuses 180a and 180b is formed on the upper surface of insulating layer 12 on substrate 14. As shown in FIG. 13a, the first electrode is defined in two sections 182a and 182b using conventional photolithography and etching steps (not illustrated). An interlayer dielectric 184 is formed over the surface of the first electrodes 182a and 182b. A photomask 198 having two openings 200a and 200b is placed over the surface of interlayer dielectric 184 and an etching step is performed to open antifuse vias 186a and 186b. FIG. 13a shows the structure resulting after the etching step but prior to removal of photomask 198.

Figure 13B:
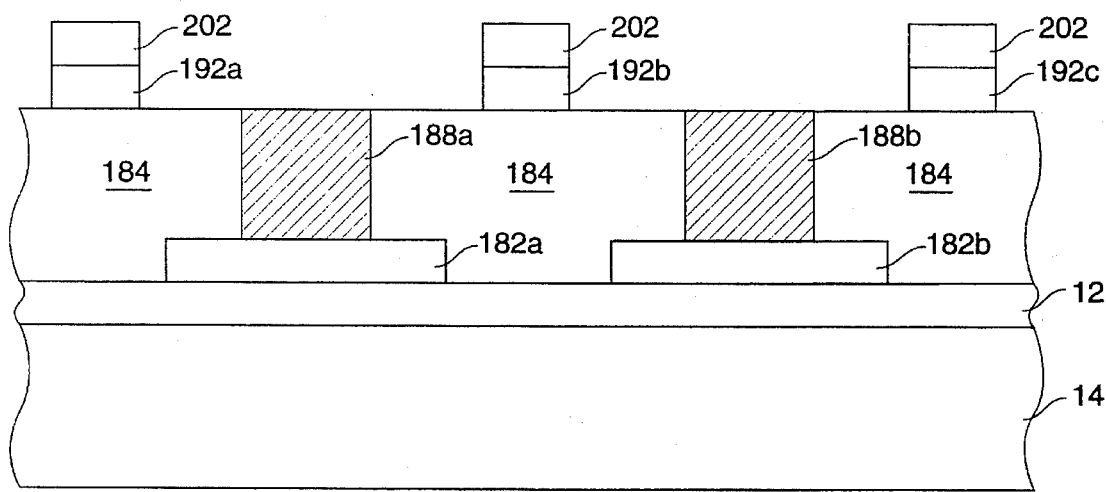

Referring now to FIG. 13b, photomask 198 is removed and tungsten plugs 188a and 188b are formed, respectively, in antifuse vies 186a and 186b. The upper surface of interlayer dielectric 184 and plugs 188a and 188b are planarized using techniques such as CMP. A film of a material such as silicon nitride is next deposited to a thickness equal to the desired thickness of the antifuse material layer, usually between about 300 angstroms and about 1,000 angstroms. A photomask 202 is placed over the film and an etching step is performed to define spacers 192a, 192b, and 192c. FIG. 13b shows the structure resulting after the spacer etching step but prior to removal of photomask 202.

Figure 13C:
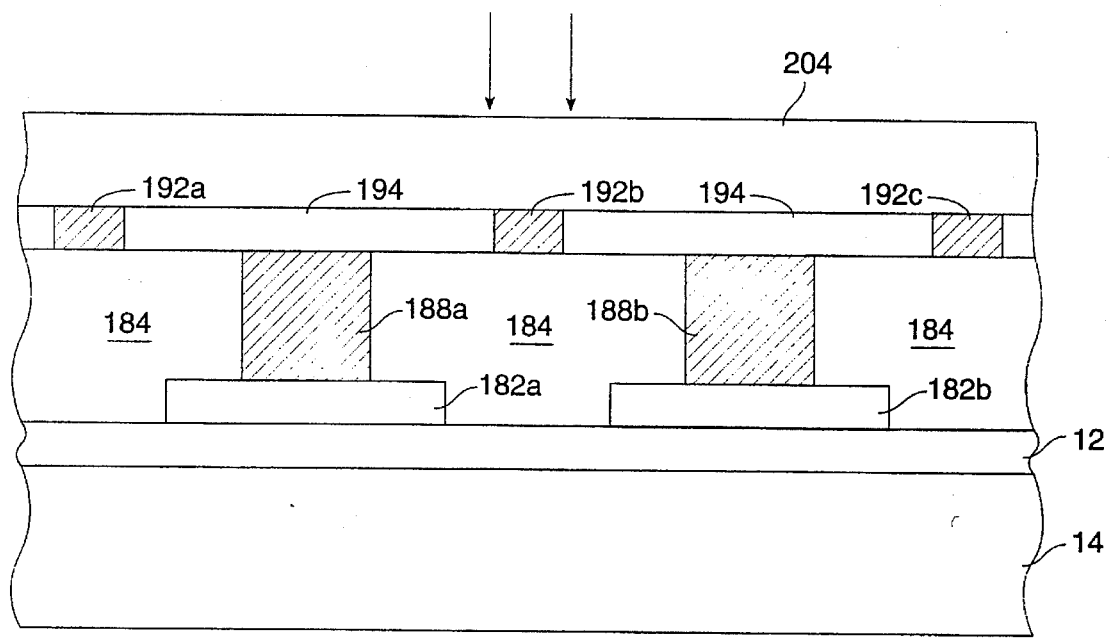

Referring now to FIG. 13c, photomask 202 is removed and an antifuse layer 194 is spun onto the wafer containing the illustrated structure. A press or roller 204 is used to level the antifuse layer 194. FIG. 13c shows the application of press or roller 204 to the surface of the wafer.

Figure 13D:
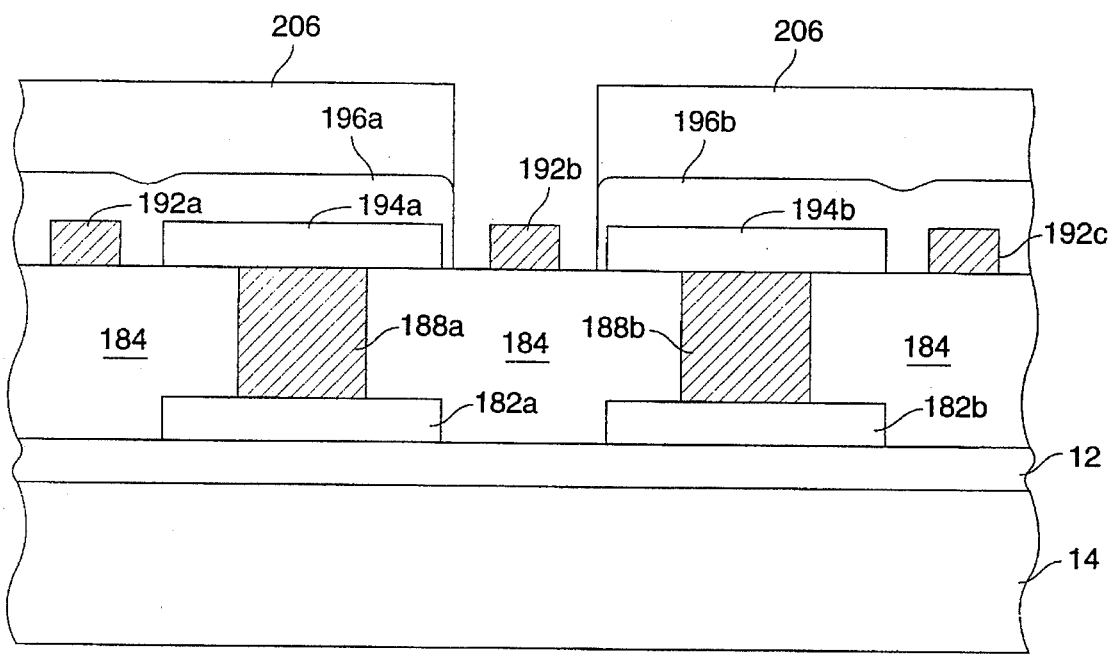

Referring now to FIG. 13d, a photomask (not shown) is applied over antifuse material layer 194 to define it into antifuse layers 194a and 194b for antifuses 180a and 180b, respectively. A metal layer is deposited to form second antifuse electrodes 196a and 196b, which are defined using photomask 206 and a conventional etching step. FIG. 13b shows the structure resulting after the second electrode etching step but prior to removal of photomask 206. After removal of the photomask 206, the finished antifuse structures are shown in FIG. 12.

Figure 14:
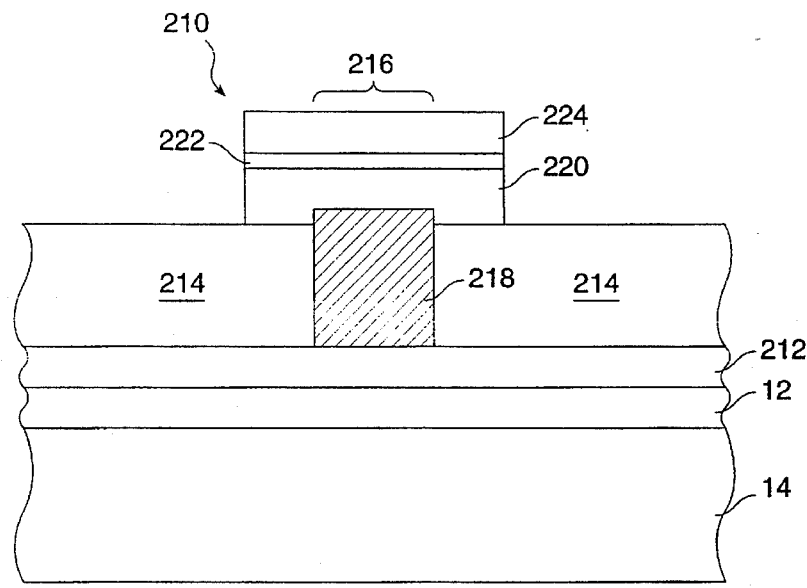
FIG. 14 is a cross-sectional view of an antifuse according to a seventh embodiment of the present invention.

An antifuse according to a seventh embodiment of the present invention is illustrated in FIG. 14. Antifuse 210 may be formed on an insulating layer 12 formed over a substrate 14. Antifuse 210 comprises a first antifuse electrode 212, formed from a material such as aluminum, disposed on insulating layer 12. An interlayer dielectric 214, having an antifuse via 216 formed therein, is disposed over the first antifuse electrode 212. A conductive plug 218 is disposed in the antifuse via 216. The upper surface of the conductive plug 218 protrudes from the upper surface of the interlayer dielectric 214 by over 100 nm. A spun-on antifuse layer 220 is disposed over the plug 218 and the interlayer dielectric 214. The thickness of the antifuse layer 220 on top of the conductive plug 218 is determined by surface tension of the spin on solution, thus a uniform thickness is achieved on top of the conductive plug 218. A barrier layer 222 is disposed over the antifuse layer 220 and an upper electrode 224 is disposed over barrier layer 222.

Figure 15A:
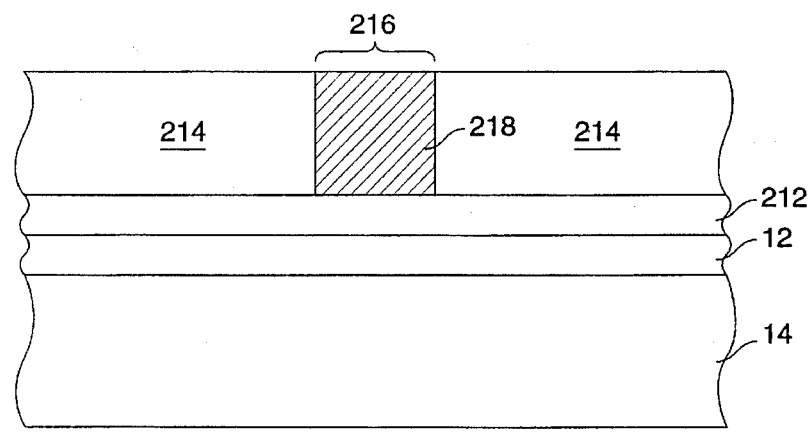
FIGS. 15a–15d are cross-sectional views of the antifuse of FIG. 14 after the completion of selected steps during its fabrication.

Referring now to FIGS. 15a–15d, the steps used to fabricate antifuse 210 will be illustrated. Referring first to FIG. 15a, a first antifuse electrode 212 is formed on insulating layer 12 over substrate 14 from a material such as aluminum. An interlayer dielectric 214 is formed over the first antifuse electrode 212. An antifuse via 216 is formed in the interlayer dielectric 214 and a conductive plug 218 is formed in the antifuse via 216. FIG. 15a shows the structure resulting after performance of these steps.

Figure 15B:
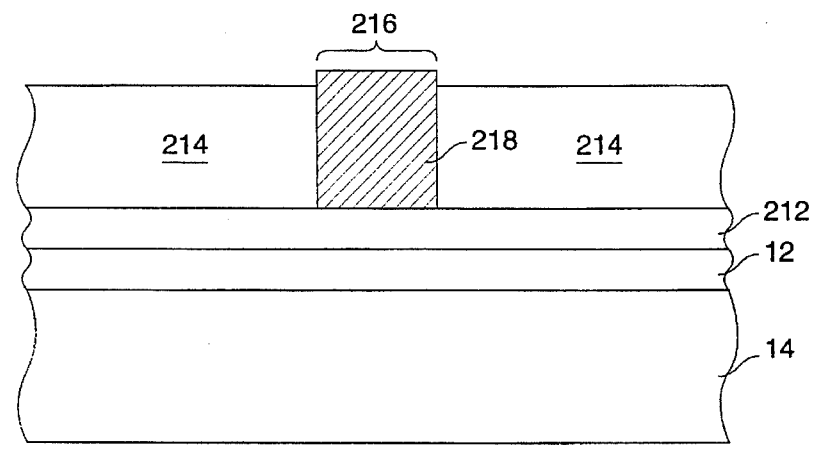

Referring now to FIG. 15b, an etching step is performed on the upper surfaces of the plug 218 and the interlayer dielectric 214 to planarize the surface and an extra over-etch is performed on the interlayer dielectric 214 to elevate the surface of the conductive plug 218, which protrudes from the interlayer dielectric 214 by over 100 nm. FIG. 15b shows the structure resulting after performance of these steps.

Figure 15C:
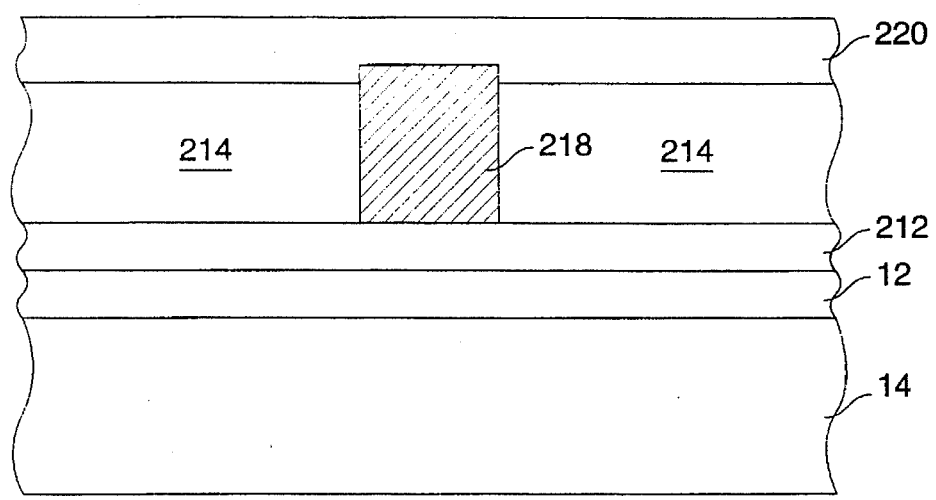

Referring now to FIG. 15c, an antifuse layer 220 is applied using spin-on techniques. The thickness of the antifuse layer 220 on top of the conductive plug 218 is determined by surface tension of the spin-on solution, thus a uniform thickness is achieved on top of all conductive plugs 218 on a wafer. FIG. 15c shows the structure resulting after performance of this spin-on step.

Figure 15D:
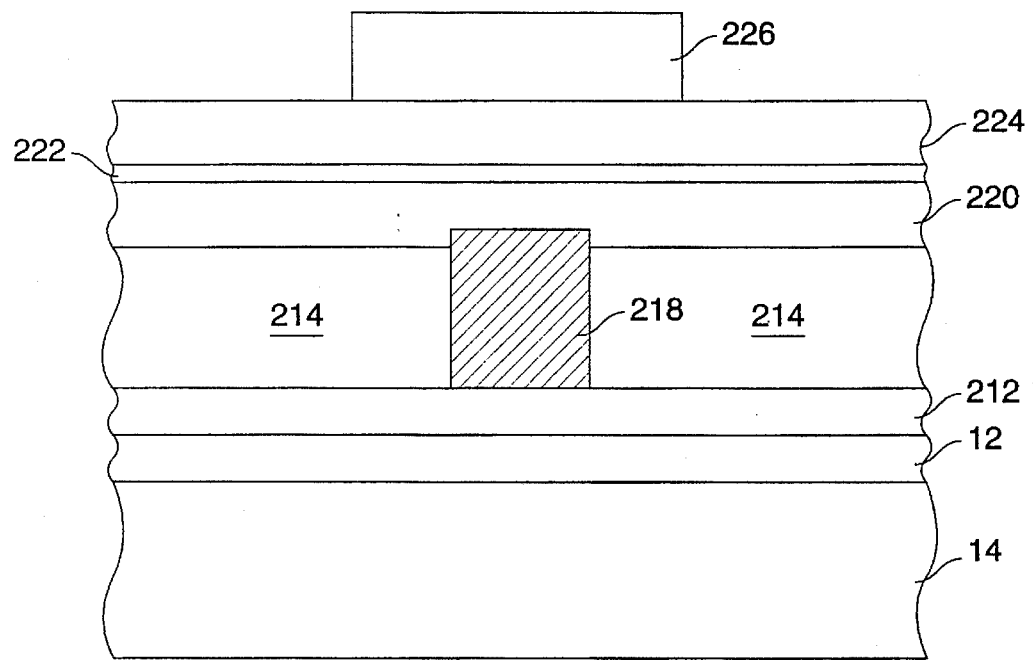

Referring now to FIG. 15d, a barrier layer 222 is formed over the antifuse layer 220. An upper electrode 224 is then formed over barrier layer 222. Known patterning techniques are used to define the upper electrode 224, the barrier layer 222 and the antifuse layer 220. FIG. 15d shows the structure resulting after formation of the barrier layer 222, the upper electrode 224, and after a masking layer 226 has been applied to define he upper electrode 224, the barrier layer 222 and the antifuse layer 220, but prior to performance of the etching step. FIG. 14 shows the completed antifuse structure after performance of this etching step and removal of masking layer 226.

Those of ordinary skill in the art will recognize that the thicknesses of the various corresponding layers in the different embodiments of the antifuse structures disclosed herein may be similar. Such skilled persons will also understand that the thicknesses called out for various ones of the layers in the antifuse structures disclosed herein will be known for use in prior antifuse and similar non-antifuse microcircuit structures. The recitations herein of layer thicknesses are therefore not to be taken as limiting, but only as illustrative.

With those understandings in mind, the first electrodes of the antifuses disclosed herein may have thicknesses of from about 5,000 angstroms to about 1 micron. The antifuse layers may have thicknesses ranging from about 100 angstroms to about 1,500 angstroms for practical integrated circuits, and larger thicknesses for applications such as programmable printed circuit boards or the like, the individual thickness of any antifuse depending of course on the desired programming voltage. With the thickness range set forth herein, the programming voltages should be less than about 25 volts.

The interlayer dielectric thicknesses may typically be in the range of from about 5,000 angstroms to about 1.5 microns. Antifuse vias may have aperture areas as small as 0.01 square microns or greater. Upper electrode thicknesses are typically about 1 micron or greater. Finally, barrier layer thicknesses are typically 2,000 angstroms thick, since their purpose is to prevent aluminum or other metals from the electrodes from diffusing into the antifuse material layer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An antifuse comprising:

a first conductive electrode;

an antifuse layer disposed over said first conductive electrode, said antifuse layer comprising a solid hydrocarbon material stable at temperatures below about 600° C., having a defect density less than about 100 defects/cm$^2$, a breakdown field less than about 10 megavolts/cm, a dielectric constant lower than about 4.0, a resistivity of greater than about 10$^4$ ohm-cm; and a second conductive electrode disposed over said antifuse layer.

2. The antifuse of claim 1 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzoclobutene polymers.

3. An antifuse comprising:
a first conductive electrode;
an interlayer dielectric disposed over said first antifuse electrode and having an antifuse via formed therein;
an antifuse layer disposed over said first conductive electrode in said antifuse via, said antifuse layer comprising a solid hydrocarbon material stable at temperatures below about 600° C., having a defect density less than about 100 defects/cm$^2$, a breakdown field less than about 10 megavolts/cm, a dielectric constant lower than about 4.0, a resistivity of greater than about $10^4$ ohm-cm; and
a second conductive electrode disposed over said antifuse layer.

4. The antifuse of claim 3 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzocyclobutene polymers.

5. An antifuse comprising:
a first conductive electrode;
an interlayer dielectric formed over said first antifuse electrode and having an antifuse via formed therein;
a conductive plug disposed in said antifuse via and planarized with an upper surface of said interlayer dielectric;
an antifuse layer disposed over said conductive plug, said antifuse layer comprising a solid hydrocarbon material stable at temperatures below about 600° C., having a defect density less than about 100 defects/cm$^2$, a breakdown field less than about 10 megavolts/cm, a dielectric constant lower than about 4.0, a resistivity of greater than about $10^4$ ohm-cm; and
a second conductive electrode disposed over said antifuse layer.

6. The antifuse of claim 5 further comprising a barrier layer formed over said antifuse layer.

7. The antifuse of claim 5 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzocyclobutene polymers.

8. An antifuse comprising:
a first conductive electrode;
a barrier layer disposed over said first conductive electrode;
an antifuse layer disposed over said barrier layer, said antifuse layer comprising a solid hydrocarbon material stable at temperatures below about 600° C., having a defect density less than about 100 defects/cm$^2$, a breakdown field less than about 10 megavolts/cm, a dielectric constant lower than about 4.0, a resistivity of greater than about $10^4$ ohm-cm;
an interlayer dielectric formed over said antifuse layer and having an antifuse via formed therein;
a conductive plug disposed in said antifuse via and in contact with said antifuse layer; and
a second conductive electrode disposed over said conductive plug.

9. The antifuse of claim 8 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzocyclobutene polymers.

10. An antifuse comprising:
a first conductive electrode;
a first barrier layer disposed over said first conductive electrode;
an antifuse layer disposed over said first barrier layer, said antifuse layer comprising a solid hydrocarbon material stable at temperatures below about 600° C., having a defect density less than about 100 defects/cm$^2$, a breakdown field less than about 10 megavolts/cm, a dielectric constant lower than about 4.0, a resistivity of greater than about $10^4$ ohm-cm;
a second barrier layer disposed over said antifuse layer;
an interlayer dielectric formed over said second barrier layer and having an antifuse via formed therein;
a conductive plug disposed in said antifuse via and in contact with said second barrier layer; and
a second conductive electrode disposed over said conductive plug.

11. The antifuse of claim 10 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzocyclobutene polymers.

12. An antifuse comprising:
a first conductive electrode;
an interlayer dielectric formed over said first antifuse electrode and having an antifuse via formed therein;
a conductive plug disposed in said antifuse via, and planarized with an upper surface of said interlayer dielectric;
a plurality of spaced-apart pads disposed on said upper surface of said interlayer dielectric, said spaced-apart pads having a thickness of between about 100 angstroms and about 1,500 angstroms;
an antifuse layer disposed over said conductive plug, said antifuse layer having a thickness equal to the thickness of said spaced-apart pads and comprising a solid hydrocarbon material stable at temperatures below about 600° C., having a defect density less than about 100 defects/cm$^2$, a breakdown field less than about 10 megavolts/cm a dielectric constant lower than about 4.0, a resistivity of greater than about $10^4$ ohm-cm; and
a second conductive electrode disposed over said antifuse layer.

13. The antifuse of claim 12 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzocyclobutene polymers.

14. An antifuse comprising:
a first conductive electrode;
an interlayer dielectric formed over said first antifuse electrode and having an antifuse via formed therein;
a conductive plug disposed in said antifuse via, an upper surface of said conductive plug extending beyond an upper surface of said interlayer dielectric;
an antifuse layer disposed over said conductive plug, said antifuse layer having a thickness equal to the thickness of said spaced-apart pads and comprising a spun-on layer of a solid hydrocarbon material stable at temperatures below about 600° C., having a defect density less than about 100 defects/cm², a breakdown field less than about 10 megavolts/cm a dielectric constant lower than about 4.0, a resistivity of greater than about $10^4$ ohm-cm; and a second conductive electrode disposed over said antifuse layer.

15. The antifuse of claim 14 wherein said antifuse material is selected from the group comprising cured polyamic acids, pre-imidazed polymers, photo-sensitive polyimides, other polimides, fluorinated polymers having dielectric constants less than about 4, paralines, polyphenylquinoxaline, perfluoropolymers, and benzocyclobutene polymers.

* * * * *

UNITED STATES PATENT AND TRADEMARK OFFICE
CERTIFICATE OF CORRECTION

PATENT NO. : 5,592,016
DATED : January 7, 1997
INVENTOR(S) : Ying Go, John L. McCollum, Abdelshafy A. Eltoukhy It is certified that error appears in the above-indentified patent and that said Letters Patent is hereby corrected as shown below:

In Col. 1, line 24, before "U.S." delete "and".

In Col. 1, line 25, before "U.S." insert --and--.

In Col. 4, line 49, after "antifuse" insert --material--.

In Col. 1, line 26, replace "," with --.--.

In Col. 1, line 49, after "etc." insert --.--.

In Col. 5, line 43, replace "has" with --have--.

In Col. 9, line 20, replace "antifuse" with --Antifuse--.

In Col. 10, line 1, after "resulting" insert --from.

In Col. 12, line 11, replace "he" with --the--.

In Col. 12, line 66, replace "polimides" with --polyimides--.

In Col. 13, line 20, replace "polimides" with --polyimides--.

In Col. 13, line 44, replace "polimides" with --polyimides--.

In Col. 14, line 26, replace "polimides" with --polyimides--.

UNITED STATES PATENT AND TRADEMARK OFFICE
CERTIFICATE OF CORRECTION

PATENT NO. : 5,592,016
DATED : January 7, 1997
INVENTOR(S) : Ying Go, John L. McCollum, Abdelshafy A. Eltoukhy It is certified that error appears in the above-indentified patent and that said Letters Patent is hereby corrected as shown below:

In Col. 14, line 48, after "megavolts/cm" insert --,--.

In Col. 14, line 55, " replace "polimides" with --polyimides--.

In Col. 15, line 5, after "megavolts/cm" insert --,--.

In Col. 16, line 4, replace "polimides" with --polyimides--.

Signed and Sealed this

Twenty-fifth Day of March, 1997

Attest:

BRUCE LEHMAN

Attesting Officer

Commissioner of Patents and Trademarks